(12) United States Patent
Naeem (10) Patent No.: US 6,177,337 B1
(45) Date of Patent: Jan. 23, 2001

(54) METHOD OF REDUCING METAL VOIDS IN SEMICONDUCTOR DEVICE INTERCONNECTION

(75) Inventor: Munir-ud-Din Naeem, Poughkeepsie, NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/003,102

(22) Filed: Jan. 6, 1998

(51) Int. Cl.[7] ................................................. H01L 21/4763
(52) U.S. Cl. ..................... 438/618; 438/620; 438/626; 438/631; 438/637; 438/698; 438/712
(58) Field of Search ..................................... 438/618, 620, 438/626, 631, 637, 672, 712, 714, 738, 720, 696

(56) References Cited

U.S. PATENT DOCUMENTS

| | | | |
|---|---|---|---|
| 4,508,815 | 4/1985 | Ackmann et al. | 430/314 |
| 4,919,748 | 4/1990 | Bredbenner et al. | 156/643 |
| 5,275,695 | 1/1994 | Chang et al. | 156/661.1 |
| 5,384,009 | 1/1995 | Mak et al. | 156/662 |
| 5,397,433 | 3/1995 | Gabriel | 156/665 |
| 5,421,891 | 6/1995 | Campbell et al. | 118/723 R |
| 5,429,070 | 7/1995 | Campbell et al. | 118/723 R |
| 5,476,816 | 12/1995 | Mautz et al. | 437/195 |
| 5,667,630 | 9/1997 | Lo | 438/653 |
| 5,702,982 | * 12/1997 | Lee et al. | 438/672 |
| 5,772,906 | * 6/1998 | Abraham | 216/72 |
| 5,846,884 | * 12/1998 | Naeem et al. | 438/714 |
| 5,976,986 | * 11/1999 | Naeem et al. | 438/714 |

FOREIGN PATENT DOCUMENTS

| | | | |
|---|---|---|---|
| 54-109775 | 8/1979 | (JP) | H01L/21/302 |
| 60-115246 | 6/1985 | (JP) | H01L/21/88 |
| 63-108752 | 5/1988 | (JP) | H01L/21/88 |

* cited by examiner

Primary Examiner—David Nelms
Assistant Examiner—Renee' R. Berry
(74) Attorney, Agent, or Firm—Steven Capella (57) ABSTRACT

The occurrence of defects in interconnect metal structure is reduced or eliminated by a method wherein a semiconductor substrate having a dielectric layer, a metal-containing electrically conductive layer and a patterned photoresist layer, the metal-containing electrically conductive layer overlying the dielectric layer and the photoresist layer overlying the conductive layer such that portions of the conductive layer are exposed, is treated using a sequence of at least four reactive ion etching environments, each having a different etchant composition from the previous and/or subsequent environment. The invention is especially applicable for metal interconnect structures having aluminum and/or copper as the primary conductive layer.

18 Claims, 7 Drawing Sheets

METHOD OF REDUCING METAL VOIDS IN SEMICONDUCTOR DEVICE INTERCONNECTION

BACKGROUND OF THE INVENTION

In integrated circuit (IC) chips, patterns of metal are used to electrically interconnect the electronic components making up the integrated circuit. Proper interconnection of the various electronic components is essential to proper and reliable performance. Thus, the occurrence of short or open circuits or other defects in the interconnect structure(s) is problematic for overall reliability. Interconnect problems may be caused not only by defects in the interconnect structures themselves, but also by defects in the portions of the chip in the vicinity of the interconnect structure. Such defects may manifest themselves during subsequent manufacturing steps leading to chip rejection or during actual use leading to problems for the end user of the IC-containing device.

Typically, interconnects are formed by depositing a layer of the desired electrically conductive material (typically, a metal or alloy) on a semiconductor substrate (i.e. over whatever other layers may already present on the substrate). Auxiliary conductive layers (e.g. Ti or TiN) may be deposited before and/or after deposition of the electrically conductive metal layer such that the auxiliary layers lie directly above and/or below the electrically conductive metal layer. The auxiliary layers are generally used to enhance the device reliability and to act as barrier layers between interconnect metallurgy and other portions of the overall IC structure (e.g., underlying or overlying dielectric layers, etc.). Portions of the conductive material layer(s) (including any auxiliary layers present) are then removed selectively whereby the conductive material remaining on the substrate forms a pattern corresponding to the desired interconnect structure.

Formation of the desired interconnect structure from the deposited conductive layer(s) is usually achieved by applying a photoresist layer over the unpatterned conductive layer(s) (i.e. over the uppermost conductive layer). The photoresist is then pattern-wise exposed to radiation and developed (i.e. portions of the photoresist layer are removed) to reveal a photoresist pattern corresponding to the pattern of the desired interconnect structure. The conductive layer(s) is then typically etched to remove the portions of the conductive layer not covered by the photoresist pattern. When the desired removal is completed, the remaining photoresist is removed to reveal the conductive material pattern (i.e. the desired interconnect structure) on the substrate. Typically, the conductive material pattern (e.g. one or more lines) has vertical or sloped sidewalls such that the pattern at the underlying substrate surface is equal or greater ir area than the pattern at the top surface of the conductive material furthest from the underlying substrate surface.

Once the desired interconnect structure is formed, typically a dielectric layer is deposited over and between the features of the interconnect structure to protect and appropriately isolate the interconnect structure.

While the above process is generally known, defects (such as voids in the interconnect metallurgy or in the dielectric deposited adjacent to the interconnect structure) can be generated by the process. Defects can be tolerated to some extent, but defects become less tolerable with reduced feature dimensions and more complex designs associated with integrated circuit manufacture. Thus, there is a need for improved interconnect structure formation processes which reduce or eliminate the occurrence of defects.

SUMMARY OF THE INVENTION

The invention provides new techniques for forming electrically conductive interconnect patterns or other metal structures which reduce or eliminate the occurrence of defects in or near those structures. The invention also provides improved etching processes for etching metal-containing patterns and is especially applicable to the etching of metal-containing interconnect patterns. The methods of tt invention are especially useful for producing patterned metal structures having reentrant profiles resulting in structures having reduced stress levels.

In one aspect, the invention encompasses a method for forming a metal-containing structure over a dielectric structure on a semiconductor substrate, where the method comprises:
(a) providing a semiconductor substrate having a dielectric layer, a lower electrically conductive barrier layer, an electrically conductive metal layer, an upper electrically conductive barrier layer, and a patterned mask layer, wherein the lower barrier layer overlies the dielectric layer, the electrically conductive metal layer overlies the lower barrier layer, the upper barrier layer overlies the electrically conductive metal layer and the photoresist layer overlies the upper barrier layer such that portions of the upper barrier layer are exposed,
(b) treating the substrate as follows:
  (i) contacting the exposed portions of the upper barrier layer under reactive ion etching conditions with a first gas mixture at a first pressure whereby a portion of the upper barrier layer is etched to expose portions of the electrically conductive metal layer,
  (ii) contacting the exposed portions of the electrically conductive metal layer under reactive ion etching conditions with a second gas mixture at a second pressure whereby bulk of the electrically conductive metal layer thickness is anisotropically etched while avoiding exposure of the lower barrier layer, the second gas mixture having a different composition from the first gas mixture,
  (iii) contacting the remaining exposed portions of the electrically conductive metal layer under reactive ion etching conditions with a third gas mixture at a third pressure whereby the remaining exposed portions of the electrically conductive metal layer is anisotropically etched to expose portions of the lower barrier layer, the third gas mixture having a different composition from the first and second gas mixtures, and
  (iv) contacting the exposed portions of the lower barrier layer under reactive ion etching conditions with a fourth gas mixture at a fourth pressure to reveal portions of the underlying dielectric layer, the fourth gas mixture having a different composition from the second and third gas mixtures, and
(c) removing the mask layer to reveal the metal-containing structure which structure includes the remaining portions of the electrically conductive metal layer and the barrier layers.

Preferably the second pressure is less than the first pressure, the third pressure is greater than the second pressure, and the fourth pressure is less than the third pressure.

In another aspect, the invention encompasses metal interconnect structures and methods of making metal interconnect structures having isolated and/or nested line features wherein at least one of the line features has a reentrant profile. The invention is especially applicable for metal interconnect structures formed from aluminum, copper and/or alloys thereof.

DETAILED DESCRIPTION OF THE INVENTION

General methods of making interconnect structures are known in the art.

At a point in the processing of a semiconductor substrate when the interconnect structure is desired, a conductive layer (i.e. combination of barrier layers and metal layers) is formed over a dielectric layer on the substrate. A patterned mask layer is then is then typically formed over the metal layer. The mask layer is typically a photoresist layer which is applied over the conductive layer and is then patterned by exposure to radiation (through a separate mask). Where a positive resist technique is used, the exposed portions of the photoresist will be removed on development (using a developer solution or other technique) to reveal the desired pattern of unexposed photoresist. Where a negative resist technique is used, the unexposed portions of the resist are removed on development (using a developer solution or other technique) to reveal the desired pattern of exposed photoresist. In either technique, the development of the photoresist pattern preferably results in exposure of portions of the underlying upper conductive barrier layer.

The exposed portions of the upper barrier layer and directly underlying portions of the electrically conductive metal layer and lower barrier layer are removed, followed by removal of any remaining photoresist and polymer residues to yield the desired interconnect structure. Typically, a further dielectric layer is then deposited or other processing steps are conducted depending on the stage of overall manufacture and the desired end product. There are many possible variations on this basic process such as the use of antireflective layers directly above or below the photoresist layer, the use of additional barrier layers, etc.

Figure 1:
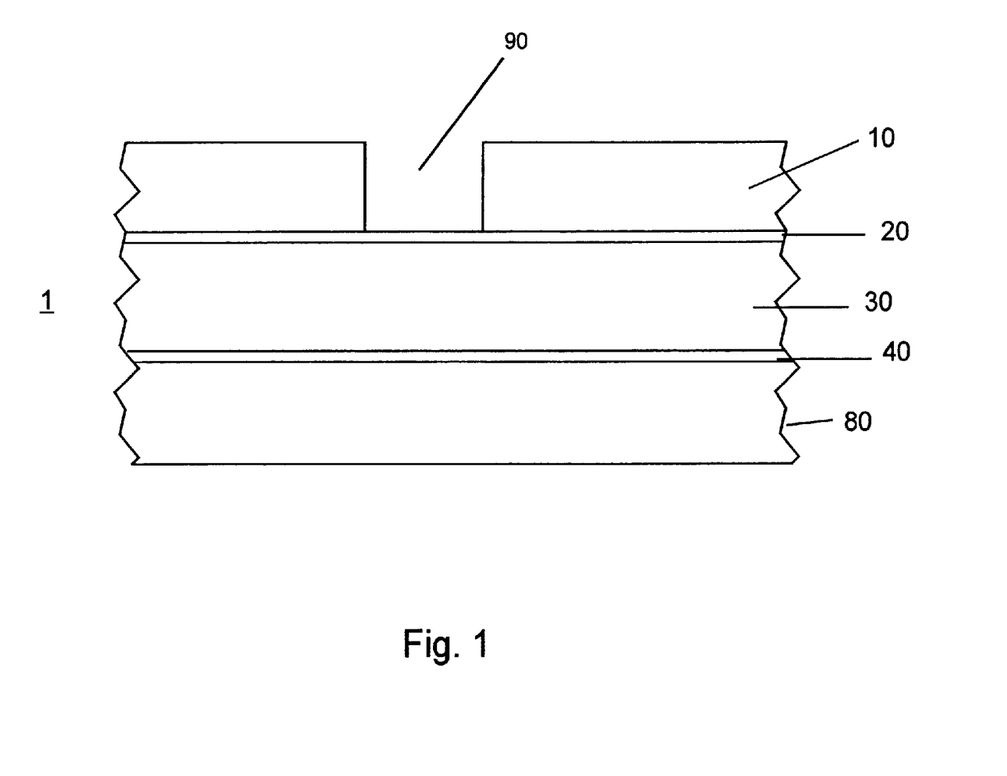
FIG. 1 is a schematic cross section view of a substrate having an applied barrier layers, a electrically conductive metal layer and patterned mask layer.

FIG. 1 illustrates a simplified schematic diagram of a substrate structure after development of the photoresist layer. The substrate 1 typically comprises a dielectric layer 80 below the electrically conductive layers. The electrically conductive layers preferably include a lower barrier layer 40 followed by an electrically conductive metal layer 30 and an upper barrier layer 20. The barrier layers are typically electrically conductive and act to prevent unwanted interactions between the electrically conductive metal layer 30 and other portions of the substrate. The barrier layers also typically improve the overall reliability of the resulting device(s). Above the upper barrier layer 20 is a patterned photoresist layer 10. Gap 90 is shown as an example of a location where the exposed conductive layers are to be selectively removed. The photoresist pattern preferably contains a multitude of such exposed areas. Selective removal of the conductive layers in these exposed areas yields the desired metal (interconnect) structure.

The conductive layer selective removal processes which form part of the invention are generally characterized by the use of reactive ion etching techniques. These techniques involve the formation of plasmas which contain various chemical constituents which are directed at the exposed areas to be etched. Thus, the reactive ion etching (RIE) process typically involves a combination of sputtering (i.e. mechanical bombardment of the surface), chemical reaction and to some extent byproduct deposition. Preferred RIE processes are those employing high ion density plasmas (HDP). These plasmas may be generated by capacitative coupling (use of parallel plate capacitors) or inductive coupling (use of a coil for source of power). The source power (the energy supplied to the coil) and the bias power (energy supplied to the bottom electrode on which the wafer or substrate rests during processing) can be varied as process parameters. The source power and bias power are also known as the top power and bottom power, respectively. The bias power is often expressed as bias voltage. The plasma density may also be enhanced by the use of magnetic field.

The processes of the invention are preferably more specifically characterized by the use of sequence of at least four etching environments. The processes are preferably further characterized in that each etching environment involves a different etchant composition (gas mixture) compared to the prior or subsequent environment. More preferably, the processes are further characterized in that each etching environment involves a different operating gas pressure compared to the prior or subsequent environment. More preferably, the processes are further characterized in that each etching environment involves a different bias voltage compared to the prior c subsequent environment.

Figure 2:
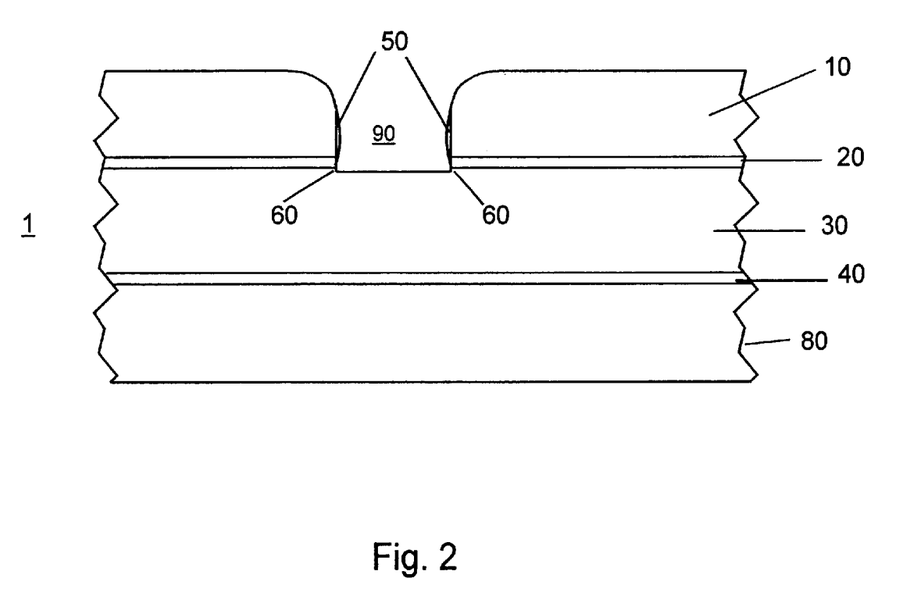
FIG. 2 is a schematic cross section view of the substrate of FIG. 1 after etching to break through the upper barrier layer.

In the first etching step, the exposed upper barrier layer is preferably contacted with a first gas mixture under reactive ion etching conditions at a first pressure whereby the exposed portions of the upper barrier layer 20 are anisotropically etched to expose portions of the electrically conductive metal layer 30 (i.e. breakthrough to the electrical conductive metal layer is achieved). This breakthrough may be determined optically or by the detection of byproducts associated with chemical reaction of the electrically conductive metal layer 30. This breakthrough step is schematically illustrated in FIG. 2. Layer 20 has been removed immediately below gap 90. Also, a deposit of byproduct polymer 50 has begun to form on the sidewalls of the gap 90. This byproduct polymer acts to protect the portions 60 of the electrically conductive metal layer 30 along the sides of the hole being etched.

The first gas mixture preferably contains at least one high molecular weight halogen compound having a molecular weight greater than about 90, more preferably at least about 120. Preferably, the halogen is selected from chlorine and/or iodine. Preferred high molecular weight gases are $BCl_3$ and HI. The first pressure is preferable at least 10 millitorr. The reactive ion etching conditions preferably include a bias voltage of at least about 225 volts. The first gas also preferably contains a $Cl_2$ component. The mole ratio of $Cl_2$ to high molecular weight gas is preferably about 0.75–1.25.

Figure 3:
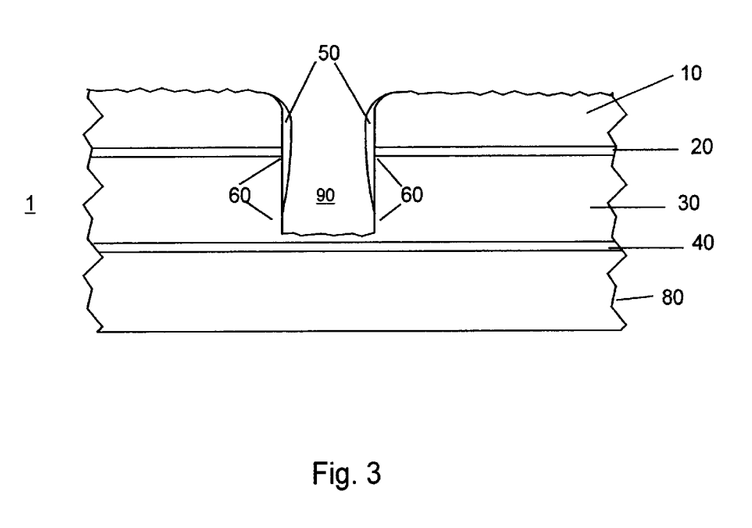
FIG. 3 is a schematic cross section view of the substrate of FIG. 2 after substantial etching of the electrically conductive metal layer.

The exposed electrically conductive metal layer 30 is then contacted with a second gas mixture at a second pressure under reactive ion etching conditions whereby the bulk of the thickness of conductive layer 30 is anisotropically etched, preferably while avoiding exposure of lower barrier layer 40 (FIG. 3). The second ga mixture has a different composition from the first gas mixture. The second pressure is preferably less than the first pressure. The time period for this etching step may be determined using trial etching runs to determine an appropriate etch time. The detection (e.g. optical omission monitoring) of byproducts from onset of etching of the lower barrier layer 40 may also be used as a means of determining when to stop the second etching step. Preferably, the second etching step is conducted until at least 80% of the thickness of the electrically conductive metal layer 30 has been removed, more preferably about 85–98%. The second etching step is typically characterized by the formation of additional byproduct polymer 50 on the sidewalls of the gap 90.

The second gas mixture preferably contains at least one low molecular weight halogen compound having a molecular weight less than about 70. Preferably, the halogen is chlorine. A preferred gas is HCl. The second pressure is preferably less than about 12 millitorr (depending on the pressure used in the first etching step), more preferably less than about 8 millitorr. The reactive ion etching conditions preferably include a bias voltage less than about 225 volts. The second gas mixture also preferably contains a $Cl_2$ component. The molar ratio of $Cl_2$ to the lower molecular weight halogen compound is preferably about 2–6.

Figure 4:
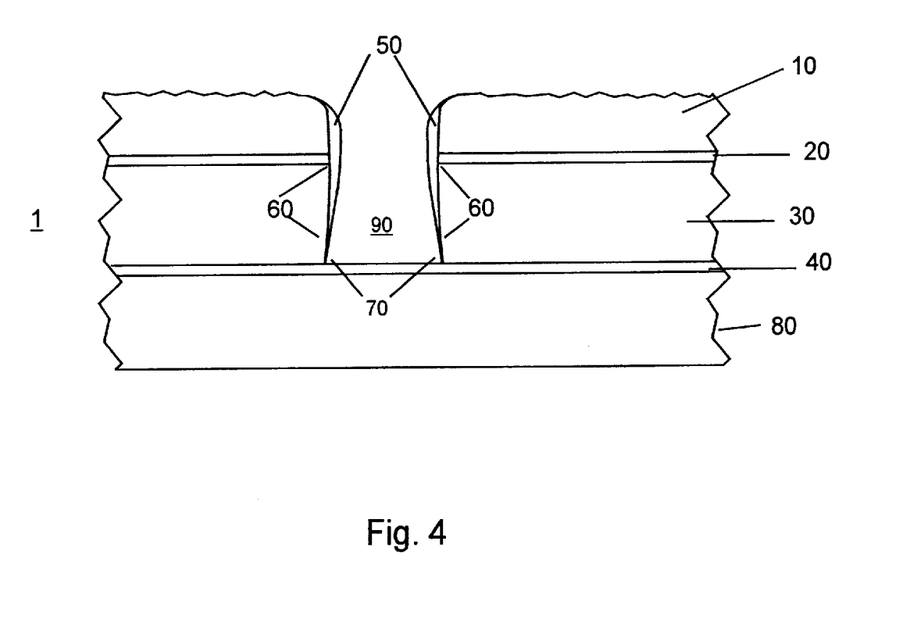
FIG. 4 is a schematic cross section view of the substrate of FIG. 3 at the en point of etching the electrically conductive metal layer.

The remaining exposed electrically conductive metal layer 30 (FIG. 3) is then preferably contacted under reactive ion etching conditions with a third gas mixture at a third pressure whereby the remaining exposed electrically conductive metal layer 30 is etched to expose lower barrier layer 40 (FIG. 4), the third gas mixture having a different composition from the first and second gas mixtures. The third pressure is preferably greater than the second pressure. The third etch step is preferably conducted until barrier layer 40 is completely exposed in the area corresponding to gap 90 in the photoresist pattern. This exposure may be determined optically or by the detection of byproducts associated with reaction of the lower barrier layer. In this step the polymer byproduct 50 deposit on the sidewall at 70 may be thinned out to some extent. A controlled amount of lateral etching of electrically conductive metal layer 30 may occur near lower barrier layer 40 resulting in a very slight reentrant profile.

The third gas mixture preferably contains at least one low molecular weight halogen compound as in the second gas mixture, however the proportion of the low molecular weight halogen compound in the third gas mixture is lower compared to the second gas mixture. This may be accomplished by reducing the flow rate of the low molecular weight halogen compound and/or by increasing the flow rate of other gas components such as $Cl_2$. The third operating pressure is preferably at least about 12 millitorr, more preferably at about 15–20 millitorr. The reactive ion etching conditions preferably include a bias voltage of about 175–250 volts. The molar ratio of $Cl_2$ to the lower molecular weight halogen compound in the third gas mixture is preferably about 4–7, but higher than for the second gas mixture if no other diluent gases are added to reduce the overall proportion of lower molecular weight halogen compound.

Figure 5:
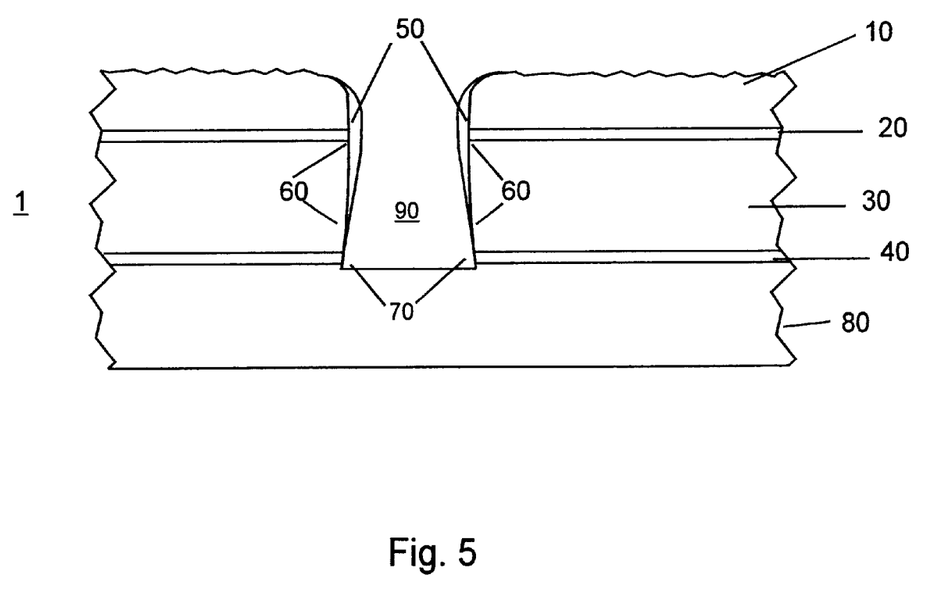
FIG. 5 is a schematic cross section view of the substrate of FIG. 4 after etching to break through the lower barrier layer with some over etching.

The exposed lower barrier layer 40 is preferably then contacted with a fourth gas mixture under reactive ion etching conditions at a fourth pressure whereby any remaining portion of lower barrier layer 40 is removed to reveal underlying dielectric layer 80, the fourth gas mixture having a different composition from the second and third gas mixtures. The fourth pressure is preferably less than the third pressure. See FIG. 5. Preferably, some overetching is also performed in this step to ensure that no conductive material remains on the dielectric surface between the locations of the desired conductive structure. The reentrant profile may be further enhanced in this step.

The fourth gas mixture preferably contains at least one high molecular weight halogen compound having a molecular weight greater than about 90, more preferably at least about 120. Preferably, the halogen is selected from chlorine and/or iodine. Preferred gases are $BCl_3$ and HI. The fourth pressure is preferably less than about 12 millitorr, more preferably about 6–8 millitorr. The reactive ion etching conditions preferably include a bias voltage of about 100–225 volts. The fourth gas mixture also preferably contains a $Cl_2$ component. The mole ratio of $Cl_2$ to high molecular weight gas is preferably about 0.75–1.5.

These etching steps are preferably conducted in the same apparatus, but in some instances, the overall process may be interrupted by transfer of the substrate to different etching apparatus. A preferred etching apparatus is model TCP 9600 manufactured by LAM Research Corporation, however other etching apparatus suitable for metal etching may be used.

Figure 6:
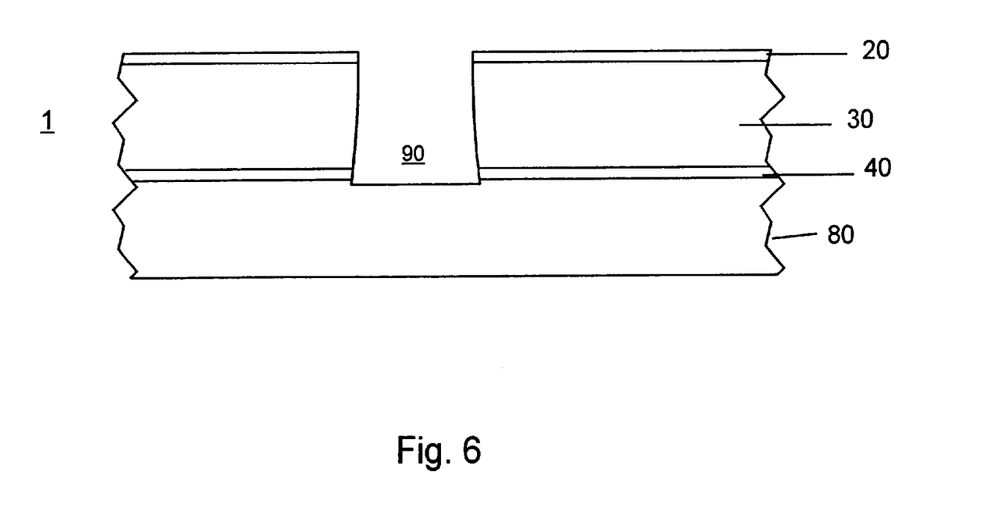
FIG. 6 is a thematic cross section view of the substrate of FIG. 5 after removal of the remaining mask layer and deposited polymer.

Once the desired etching has been accomplished, the remaining resist (or other mask material) and any polymer byproducts from the etching process are removed using known techniques. The resulting structure is schematically shown in FIG. 6.

The invention is especially useful for formation of metal structures (such as interconnects) where the primary conductive layer comprises a metal selected from the group consisting of aluminum, copper and alloys thereof. Preferably, the primary conductive material is an aluminum-copper alloy, more preferably, an alloy containing about 0.5 wt. % Cu. The invention is especially applicable to formation of metal structures comprising upper and lower barrier layers as indicated above. Any known barrier layer materials may be used. Preferably, the barrier layers contain one or more materials selected from the group consisting of Ti, TiN, or known refractory metals (e. W, Cr, etc.) or refractory metal nitrides and combinations thereof. The underlying dielectric on the substrate is preferably a nitride such as silicon nitride or silicon oxynitride, however other suitable dielectric materials may be used.

The invention further encompasses metal interconnect structures having one or more lines (isolated and/or nested) where at least one of the lines has a reentrant profile, more preferably a slightly reentrant profile. It has been discovered that such profiles result in reduced stress and fewer voids/defects of subsequent application of additional dielectric material.

Figure 7:
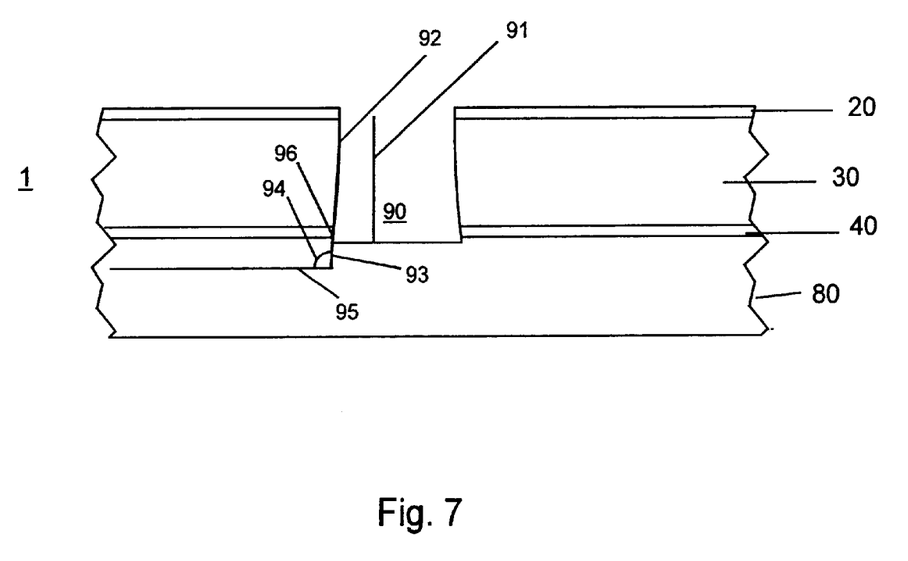
FIG. 7 is schematic cross section view of the substrate of FIG. 6 illustrating the measurement of reentrant profile.

Referring to FIG. 7, the reentrant profile is preferably defined by angle 94. Angle 94 is defined by the extension of an imaginary line 93 from (a) point 92, the lowest point in the conductive layer which is closest in horizontal distance to an imaginary vertical line 91 in gap 90, line 91 being normal to the substrate surface (dielectric layer 80), through (b) point 96, the lowest point in the conductive layer which is furthest in horizontal distance to an imaginary vertical line 91 in gap 90. Angle 94 is further defined by the intersection of line 93 with an imaginary line 95 which is parallel to the surface of dielectric layer 80. A reentrant profile is defined as an angle 94 being greater than 90°. More preferably, the reentrant profile according to the invention corresponds angle 94 being between 90 and 100°, most preferably between 91 and 95°. Angle 94 as illustrated in FIG. 7 is about 93.7°.

Reentrant profiles may be produced by the above described methods in the third etching step by reducing the relative proportion of the low molecular weight halogen compound and/or by reducing the bias voltage. These steps cause a thinning of the protective polymer deposit on the side walls such that some limited lateral etching occurs to generate the reentrant profile. This technique may be used in any process where the main conductive layer etch creates a protective polymer deposit or the sidewalls. That is, the main etch can be followed with a further etch under conditions to thin the protective deposit such that some limited lateral etching occurs I generate a desired reentrant profile.

Thus, it should be understood that the invention is not limited to interconnect structures having three layers. If desired, the methods of the invention may be practiced with more or less complex interconnect layer structures. If desired, plural upper barrier layers, plural lower barrier layers and/or plural conductive metal layers (i.e. a laminate may be used. In such instances, the first etching step preferably corresponds to breakthrough all the upper barrier layers and the third etching step preferably corresponds to exposure of the lower barrier layer furthest from underlying dielectric. The metal structures formed using the method of the invention preferably contain one or more features selected from isolated lines, nested lines and combinations thereof. The invention is especially useful for preventing defects at isolated lines and the outer lines of nested line structures by creation of lines having slightly reentrant profiles. The invention is especially useful for producing interconnect structures having line widths less of about 0.5 microns or less, especially lines having widths of 0.4 microns or less.

Other variations may be made in the above described methods of the invention without departing from the scope of the invention. Similarly, variations may be made ir the metal structure to be produced by the methods of the invention without departing from the scope of the invention.

What is claimed is:

1. A method for forming a metal-containing structure over a dielectric structure on a semiconductor substrate, said method comprising:

(a) providing a semiconductor substrate having a dielectric layer, a lower electrically conductive barrier layer, an electrically conductive metal layer, an upper electrically conductive barrier layer, and a patterned mask layer, wherein said lower barrier layer overlies said dielectric layer, said electrically conductive metal layer overlies said lower barrier layer, said upper barrier layer overlies said electrically conductive metal layer and said patterned mask layer overlies said upper barrier layer such that portions of said upper barrier layer are exposed, (b) treating the substrate as follows:
(i) contacting the exposed portions of said upper barrier layer under reactive ion etching conditions with a first gas mixture at a first pressure whereby a portion of said upper barrier layer is etched to expose portions of said electrically conductive metal layer, said first gas mixture consisting essentially of $Cl_2$ and at least one high molecular weight halogen compound having a molecular weight greater than about 90, (ii) contacting said exposed portions of said electrically conductive metal layer under reactive ion etching conditions with a second gas mixture at a second pressure whereby the bulk of said electrically conductive mete layer thickness is anisotropically etched while avoiding exposure of said lower barrier layer, said second gas mixture having a different composition from said first gas mixture, said second gas mixture consisting essentially of $Cl_2$ and at least one low molecular weight halogen compound having a molecular weight less than about 70, (iii) contacting remaining exposed portions of said electrically conductive metal layer from step (ii) under reactive ion etching conditions with a third gas mixture at a third pressure whereby said remaining exposed portions of said electrically conductive metal layer are anisotropically etched to expose portions of said lower barrier layer, said third gas mixture having a different composition from said first and second gas mixtures, and (iv) contacting said exposed portions of said lower barrier layer under reactive ion etching conditions with a fourth gas mixture at a fourth pressure to reveal portions of said underlying dielectric layer, said fourth gas mixture having a different composition from said second and third gas mixtures, and (c) removing said mask layer to reveal said metal-containing structure which structure includes remaining portions of said electrically conductive metal layer and said barrier layers.

2. The method of claim 1 wherein said patterned mask layer is a patterned photoresist layer.

3. The method of claim 1 wherein said third mixture gas contains at least one low molecular weight halogen compound having a molecular weight less than about 70, said third gas mixture having a lower proportion of said low molecular weight halogen compound than said second gas mixture.

4. The method of claim 1 wherein said fourth gas mixture contains at least one high molecular weight halogen compound having a molecular weight greater than about 90.

5. The method of claim 1 wherein said first gas mixture has a molar ratio of $Cl_2$ to said high molecular weight halogen compound of about 0.75–1.25.

6. The method of claim 1 wherein said second gas mixture has a molar ratio of $Cl_2$ to said low molecular weight halogen compound of about 2–6.

7. The method of claim 3 wherein said third gas mixture further contains $Cl_2$ and said third gas mixture has a molar ratio of $Cl_2$ to said low molecular weight halogen compound of about 4–7.

8. The method of claim 6 wherein said fourth gas mixture further contains $Cl_2$ and said fourth gas mixture has a molar ratio of $Cl_2$ to said high molecular weight compound of about 0.75–1.5.

9. The method of claim 4 wherein said high molecular weight gas in said first and fourth gas mixtures is selected from the group consisting of $BCl_3$ and HI.

10. The method of claim 4 wherein said low molecular weight gas in said second and fourth gas mixtures is HCl.

11. The method of claim 1 wherein said second pressure is less than said first pressure, said third pressure is greater than said second pressure, and said fourth pressure is less than said third pressure.

12. The method of claim 1 wherein said metal-containing structure is an interconnect structure comprising at least one feature selected from the group consisting of isolated lines and nested lines.

13. The method of claim 1 wherein at least a portion of said metal-containing structure contains a metal selected from the group consisting of Cu, Al, and mixtures thereof.

14. The method of claim 1 wherein at least one of said barrier layers contains a refractory metal or refractory metal compound.

15. The method of claim 14 wherein said refractory metal or metal compound contains at least one refractory metal selected from the group consisting of Ti, W and Cr.

16. The method of claim 15 wherein said refractory metal or metal compound contains titanium.

17. The method of claim 12 wherein at least a portion of the interconnect structure revealed in step (c) has a reentrant profile.

18. The method of claim 1 wherein overetching takes place in step (b) (iv).

* * * * *